United States Patent
Schaper

[19]

[11] Patent Number: 6,018,616
[45] Date of Patent: Jan. 25, 2000

[54] THERMAL CYCLING MODULE AND PROCESS USING RADIANT HEAT

[75] Inventor: Charles D. Schaper, Union City, Calif.

[73] Assignee: Applied Materials, Inc., Santa Clara, Calif.

[21] Appl. No.: 09/028,177

[22] Filed: Feb. 23, 1998

[51] Int. Cl.[7] .............................. C23C 16/00; F27B 5/14; F29B 29/00
[52] U.S. Cl. .......................... 392/418; 219/411; 219/390; 118/724; 118/732; 118/50.1; 62/3.3; 62/3.7; 62/179; 62/331; 165/64; 165/80.4
[58] Field of Search .................................. 219/390, 405, 219/411; 392/418; 118/724, 725, 728, 732, 50.1; 62/3.2, 3.3, 3.7, 177, 179, 180, 337; 165/61, 64, 80.1, 80.2, 80.4, 104.13, 104.14, 104.19, 104.28, 104.31, 104.33

[56] References Cited

U.S. PATENT DOCUMENTS

| | | | |
|---|---|---|---|
| 3,836,751 | 9/1974 | Anderson | 219/411 |
| 4,011,104 | 3/1977 | Basiulis | 165/104.33 |
| 4,081,313 | 3/1978 | McNeilly et al. | 118/725 |
| 4,640,224 | 2/1987 | Bunch et al. | 118/725 |
| 5,228,501 | 7/1993 | Tepman et al. | 165/80.1 |
| 5,290,381 | 3/1994 | Nozawa et al. | 118/725 |
| 5,404,272 | 4/1995 | Lebailly et al. | 165/104.33 |
| 5,418,885 | 5/1995 | Hauser et al. | |
| 5,431,700 | 7/1995 | Sloan | |
| 5,436,172 | 7/1995 | Moslehi | |
| 5,444,217 | 8/1995 | Moore et al. | |
| 5,444,815 | 8/1995 | Lee et al. | 392/416 |
| 5,567,267 | 10/1996 | Kazama et al. | 165/80.2 |
| 5,584,971 | 12/1996 | Komino | 118/725 |
| 5,595,241 | 1/1997 | Jelinek | 165/80.1 |
| 5,802,856 | 9/1998 | Schaper et al. | 62/3.7 |

FOREIGN PATENT DOCUMENTS

| | | |
|---|---|---|
| 0374511 A2 | 6/1990 | European Pat. Off. . |
| 728850 | 8/1996 | European Pat. Off. . |
| 64-25985 | 1/1998 | Japan . |
| 9805060 | 2/1998 | WIPO . |
| WO 98/05060 | 2/1998 | WIPO . |

OTHER PUBLICATIONS

Database WPI, Section Ch. Week 8910, Derwent Publications Ltd., London, GB; Class L03, AN 89–073219, Jan. 27, 1989.

*Primary Examiner*—Jospeh Pelham
*Attorney, Agent, or Firm*—Arnold, White & Durkee

[57] ABSTRACT

In general, the present invention provides a single thermal cycling module for baking and chilling a substrate, such as a wafer, that is in thermal contact with a foil heater, a heat exchanger, and a radiation heater. The radiation heater thermally heats a fluid contained by the heat exchanger, which in turn, thermally bakes the substrate at a desired temperature. When the radiation heater is deactivated, a fluid circulates through the heat exchanger to chill the substrate. The foil heater assists the baking and chilling phases by elevating the temperature of the substrate when necessary to prevent or regulate temperature fluctuations of the substrate temperature. Both the radiation heater and the foil heater can provide several zones for varying the heat applied across the substrate, and a single fluid temperature is provided to the heat exchanger for both baking and chilling cycles.

16 Claims, 5 Drawing Sheets

THERMAL CYCLING MODULE AND PROCESS USING RADIANT HEAT

FIELD OF THE INVENTION

This invention relates generally to a thermal cycling method and apparatus for material substrates. More particularly, it relates to a thermal cycling module using a single temperature fluid circulated through a heat exchanger that is in thermal contact with a radiation heater.

BACKGROUND OF THE INVENTION

Certain stages of semiconductor manufacturing require baking the semiconductor substrate material, such as a wafer, and subsequently chilling it. For example, the photoresist processing stage of semiconductor manufacturing requires such baking and chilling, or thermal cycling, process. In order to produce high quality wafers suitable for present integrated circuit applications, the temperature of the wafer during this thermal cycling must be precisely controlled with respect to both the temporal temperature profile of the baking and chilling cycles and to the uniformity of the temperature across the substrate.

The conventional method for baking and chilling wafers involves first baking the wafer at a temperature ranging typically between 70° C. and 270° C. for a period of time ranging typically between 28 seconds and 90 seconds. After baking the wafer, the wafer is mechanically moved to a cold plate where it is chilled to a temperature ranging typically between 0° C. and 28° C.

There are several disadvantages to the above method. First, moving a wafer through the air between the hot and cold plates subjects the wafer to uncontrolled temperature variations during the bake and chill cycles. Moreover, the time required to move the wafer between the bake and chill plates prevents the realization of very short thermal transition times. Finally, mechanically moving the wafer from the hot plate to the cold plate can contaminate or otherwise damage the wafer.

Attempts have been made to overcome the disadvantages of separate bake and chill plates. One apparatus places the hot plate upside down and directly above the cold plate. Because the wafer moves only a short distance from the cold plate directly upward to the hot plate, the apparatus reduces the uncontrolled and non-uniform temperature fluctuations normally present during the transition from the baking step to the chilling step. Nevertheless, because the wafer must be moved between separate bake and chill plates, the wafer is still subjected to uncontrolled and non-uniform temperature fluctuations during thermal cycling. Moreover, physical movement inhibits short thermal transition times. Finally, the wafer may still be exposed to contaminates or otherwise damaged during the physical movements from the hot plate to the cold plate.

SUMMARY OF THE INVENTION

The present invention provides an improved apparatus and method for the thermal cycling of material substrates such as wafers used in the manufacture of semiconductors. In particular, the present invention provides an improved apparatus for thermal cycling that eliminates the need to move the substrate between distinct bake or chill plates, provides improved continuous control of substrate temperature throughout the entire baking and chilling cycle, and provides uniform temperature profiles on the baking and chilling surface.

In one aspect of the invention, a thermal cycling module is provided to heat and cool a material substrate. The module includes a heat exchanger comprising a fluid chamber defined by a top and a bottom surface separated by a periphery surface and at least one fluid inlet/outlet in fluid communication with the chamber; a radiation heater in thermal contact with the bottom surface of the heat exchanger; and a power source in electrical contact with the radiation heater.

In another aspect of the invention, a method for thermally cycling a material substrate is provided. The process comprises: positioning the substrate in thermal contact with a heat exchanger and a first and a second heating element, the heat exchanger includes a fluid chamber having at least one fluid inlet/outlet; filling the heat exchanger with a thermally conductive fluid; generating heat from the first heating element to the heat exchanger and the substrate; generating heat from the second heating element to the heat exchanger for a predetermined time period; and circulating the thermally conductive fluid through the at least one inlet/outlet of the heat exchanger after the predetermined time.

BRIEF DESCRIPTION OF THE DRAWINGS

The advantages, features, and design of the invention will become apparent from the following detailed description of the invention and the accompanying drawings. Similarities between the figures will be apparent by the use of the same reference numerals to refer to like elements.

DETAILED DESCRIPTION OF THE INVENTION

The following description of a preferred embodiment of the invention contains specific details for purposes of illustrating the present invention. Those of ordinary skill in the relevant arts will appreciate that the essential ideas and principles of the invention may be implemented in various ways and that such variations are within the scope of the present invention.

In general, the present invention provides a single thermal cycling module for baking and chilling a substrate, such as a wafer, that is in thermal contact with a heat exchanger and a radiation heater. The radiation heater thermally heats a fluid contained by the heat exchanger, which in turn, thermally bakes the substrate at a desired temperature. When the radiation heater is deactivated, a fluid circulates through the heat exchanger to chill the substrate. If desired, a heating element, such as a foil heater, can be implemented between the wafer and heat exchanger to assist the baking and chilling cycles. Both the radiation heater and the heating element can provide several zones for varying the heat applied across the substrate. A single fluid temperature is provided to the heat exchanger for both the baking and chilling cycles.

Because the substrate is not moved during the entire baking and chilling cycle, the invention avoids problems associated with the transfer of the substrate between separate bake and chill plates. Additionally, by using a radiation source for the baking cycles and a single temperature fluid for both baking and chilling cycles, the invention avoids the need for a control system and apparatus for providing various fluid temperatures to a heat exchanger during the baking or chilling cycles. Consequently, the instant invention, as will be described in detail below, provides a highly effective and energy efficient thermal cycling process.

Figure 1:
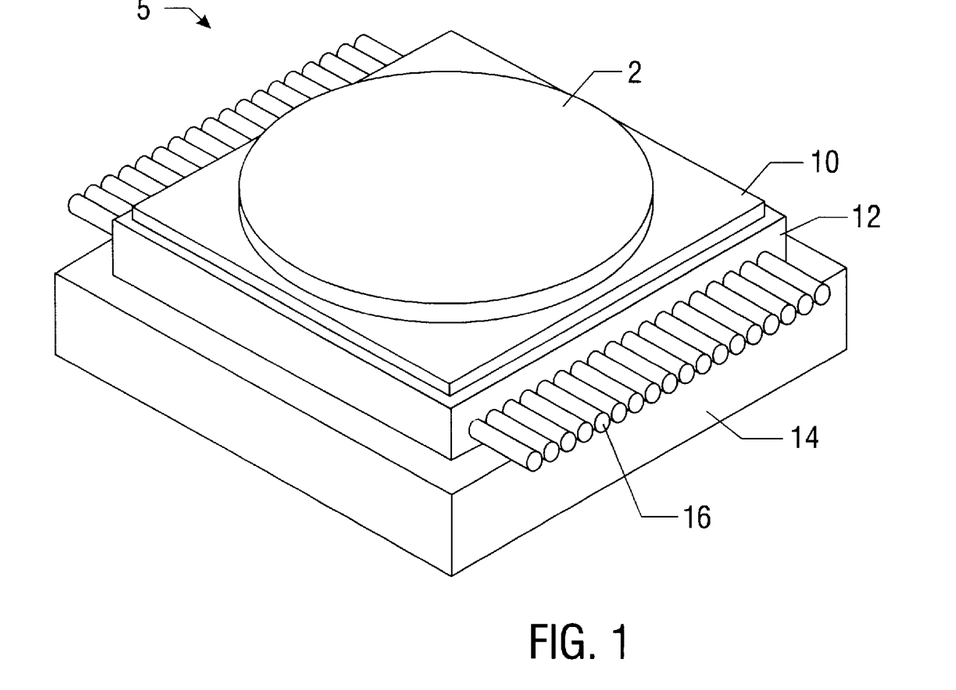
FIG. 1 is a perspective view of an embodiment of the thermal cycling module of the present invention.

Turning now to the drawing, FIG. 1 illustrates a perspective view of a substrate 2, such as a semiconductor wafer, in conjunction with a thermal cycling module 5 according to a preferred embodiment of the invention. Substrate 2, baked and chilled through thermal contact by thermal cycling module 5, is never moved and precise temperature constants are achieved over specific times. Consequently, an effective and an efficient thermal cycling process for baking and chilling a material substrate is achieved.

In accordance with the following disclosure, thermal contact is defined to include physical proximity or direct physical contact sufficient to permit the transfer of heat. It will be appreciated by persons of ordinary skill in the relevant arts that although the present description uses physical proximity thermal contact for purposes of definiteness, any of the known methods of thermal contact may be used.

Figure 2:
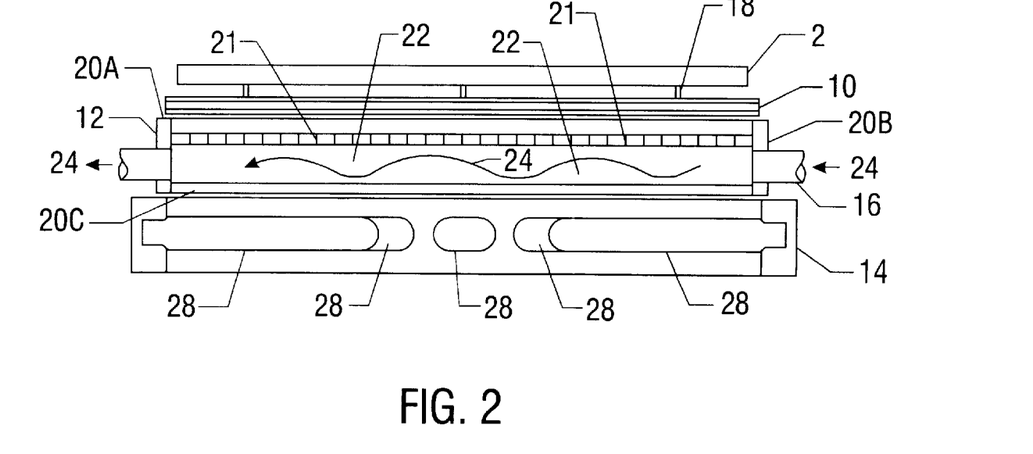
FIG. 2 is a horizontal cross-section view of the embodiment of the thermal cycling module of FIG. 1.

As illustrated in FIGS. 1 and 2, thermal cycling module 5, coupled to a power source (not shown), comprises a foil heater 10, a heat exchanger 12, and a radiation heater 14. Preferably, foil heater 10 is fixedly attached with an adhesive to heat exchanger 12, as is generally known in the art. Inlet and outlet pipes 16 circulate a conductive fluid through heat exchanger 12. The fluid provided to heat exchanger 12 will always be the same temperature, e.g., 20° C. Consequently, the only time that the temperature of the fluid will substantially change is during such time that the fluid is contained by heat exchanger 12 and radiation heater 14 is active. Radiation heater 14 is positioned below heat exchanger 12 to provide thermal contact with substrate 2 using the fluid contained by heat exchanger 12. Pumps (not shown) connected to inlet and outlet pipes 16 circulate fluid through heat exchanger 12.

Using conventional separators 18, as illustrated in FIG. 2, substrate 2 is positioned at a distance of about 0.1 mm above foil heater 10. The close proximity of substrate 2 to foil heater 10 allows for an effective and efficient heat transfer with minimum contact. If desired, separators 18 can be replaced with pin lifts (not shown). The pin lift, using conventional mounting techniques and a linear actuator, will allow the substrate height from foil heater 10 to be adjusted or rotated during the thermal cycling process. On the other hand, if it is desired to eliminate separators 18, a conductive plate or protective mask (neither shown) can be positioned directly between the foil heater 10 and substrate 2. Although it is possible to place substrate 2 directly on foil heater 10, it is typically not preferred because of possible contamination effects.

It will be clear to one of ordinary skill in the relevant arts that the above embodiments may be altered in many ways without departing from the scope of the invention. For example, alterations to the above embodiments include electrostatically clamping the substrate and holding the substrate with a vacuum line or by gravity to foil heater 10, or heat exchanger 12 when foil heater 10 is not necessary.

Heat exchanger 12 includes a top surface 20A, periphery surfaces 20B, and a bottom surface 20C to provide a chamber 22 for containment and circulation of fluid 24. If desired, fins 21 are attached to top surface 20A and provides a honeycomb structure within the upper region of chamber 22. Fins 21 with this or a similar structure will increase the thermal coefficient between the heat exchanger and substrate during operation.

Top and side surfaces 20A and 20B are made from a material such as aluminum, copper, or ceramic, and fins 21 are preferably a gold plated alloy. To help with the transfer of heat from radiation heater 14 to fluid 24 within heat exchanger 12, bottom surface 20C is preferably made from a transparent material such as quartz.

It will be appreciated by persons of ordinary skill in the relevant arts that although the present description provides a single embodiment for introducing fluid 24 into chamber 22 of heat exchanger 12, i.e., inlet and outlet pipes 16, any conventional method can be used. For example, a method of introducing fluid from bottom surface 20C, preferably near the center of an apparatus, that exits near the periphery surfaces 20B of the heat exchanger, or visa versa, could be used. In turn, fluid injectors could be positioned to introduce/disburse fluid 24 into chamber 22 from top, bottom or side surfaces 20A, 20B and 20C, respectively, using conventional methods. With respect to chamber 22 of heat exchanger 12, once fluid 24 is within chamber 22, any conventional method could be used that would guide fluid 24 through a specific continuous, circular, or disjointed fluid-path before it exits.

Radiation heater 14 includes a plurality of light bulbs 28 arranged in a specific design to provide a uniform heat distribution fluid 24 inside heat exchanger 12. Fluid 24 contained by heat exchanger 12 transfers heat to substrate 2 when radiation heater 14 is active. Otherwise, fluid 24 cools substrate 2 as it flows through heat exchanger 12. Consequently, fluid 24, with the help of radiation heater 14, roughly determines the temperature of the entire substrate 2, while foil heater 10 precisely determines local variations in the temperature of specific regions in substrate 2.

Because the temperature of the substrate 2 is typically determined largely by the temperature of fluid 24 contained or flowing through heat exchanger 12, it may be desirable to use fluids other than water, such as pressurized steam, dry air, or nitrogen gas. Thus, it follows that any type of thermally conductive fluid can be used to flow through chamber 22. However, some fluids are better than others depending on the temperature needed during the thermal cycling process. For example, a preferred fluid 24 for low temperature applications of less than 170° C. would include water and ethylene glycol. On the other hand, for high temperature applications of greater than 170° C., silicon oil, propylene glycol or FLUORINERT™, which is manufactured by Minnesota Mining & Manufacturing Corporation of St. Paul, Minn., would preferably be used as fluid 24.

Additionally, if desired, the above thermal cycling module could be placed into an enclosure to minimize convective loss.

Figure 3:
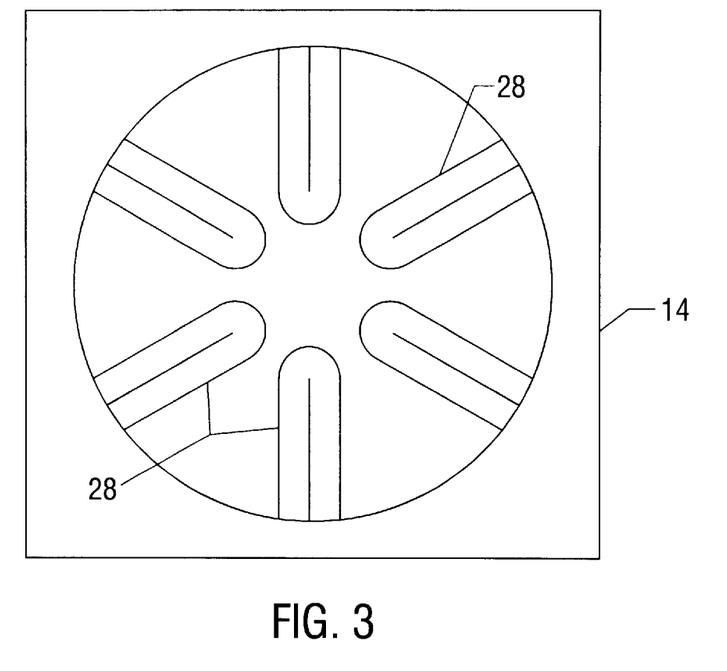
FIG. 3 is a top plan view of an embodiment of the radiation heater of FIG. 1.

Referring now to FIG. 3, a top plan view of radiation heater 14 is shown in accordance with a preferred embodiment. Light bulbs 28, such as Tungsten-Halogen lamps, are arranged along a planar surface in a radial direction toward the center of radiation heater 14. With this arrangement, bulbs 28 of about 1 kW will generate a uniform energy flux to heat fluid 24 contained within heat exchanger 12.

Figure 4A:
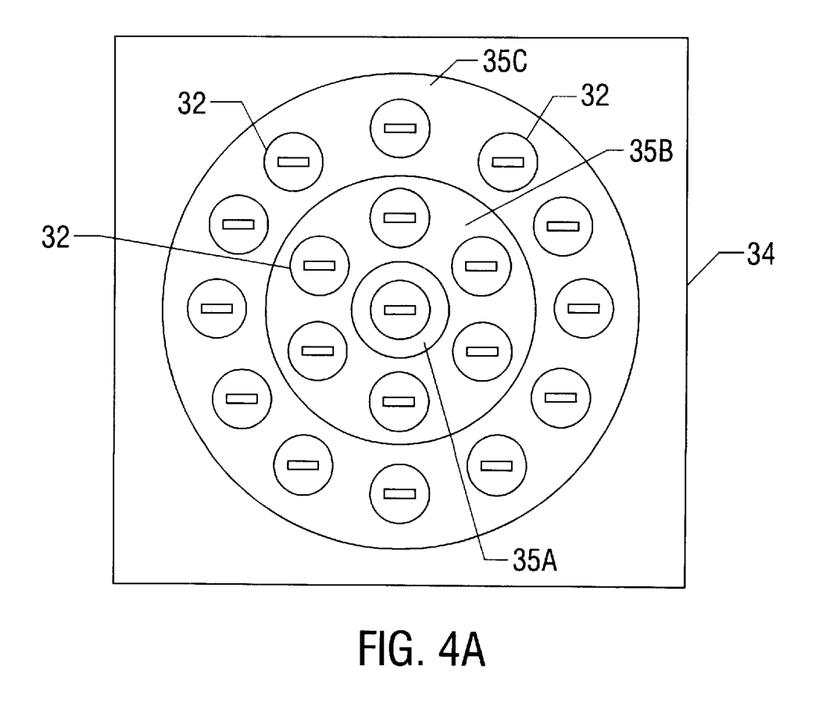
FIGS. 4A and 4B are top plan views of alternative embodiments of the radiation heater of FIG. 1.
Figure 4B:
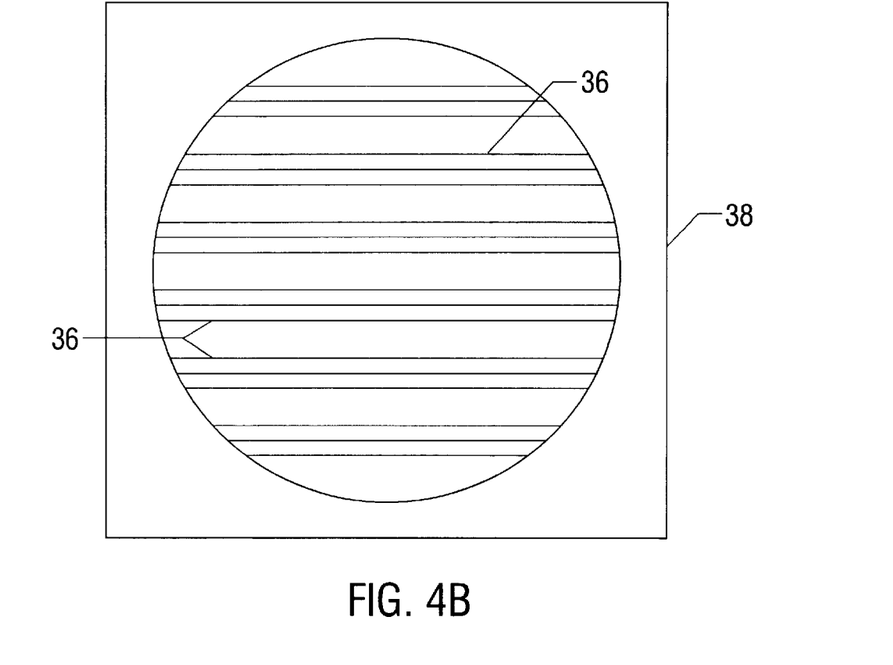

As will be appreciated by persons of ordinary skill in the relevant arts, various bulb shapes can be used to form a variety of radiant heater structures. For example, as illustrated in FIG. 4A, by using semi-square light bulbs 32 that provide a majority of the filament at a top end of the bulb 32, a radiation heater 34 having a structure similar to a bulls-eye can be developed. Each ring of bulbs 32 provides a heating zone 35A–35C that can be specifically controlled if desired. FIG. 4B illustrates how longitudinal bulbs 36, e.g., florescent bulbs, can be used to form a radiation heater 38 having a grid-like arrangement. Either alternative structure of radiation heaters 34 and 38 will provide the necessary uniform energy flux to substrate 2 using fluid 24 contained by heat exchanger 12. Additionally, conventional techniques for powering radiation heaters 14, 34, and 38 with or without modulators (not shown), and attaching bulbs 28, 32, and 38, can be employed.

Figure 5:
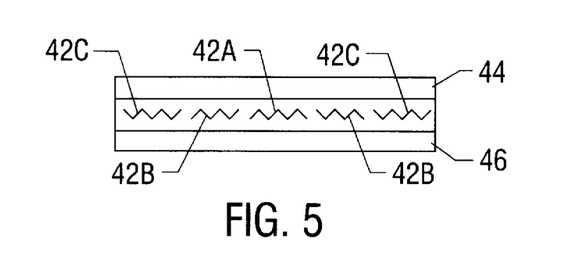
FIG. 5 is a horizontal cross-sectional view of one embodiment of the foil heater of FIG. 1.
Figure 6:
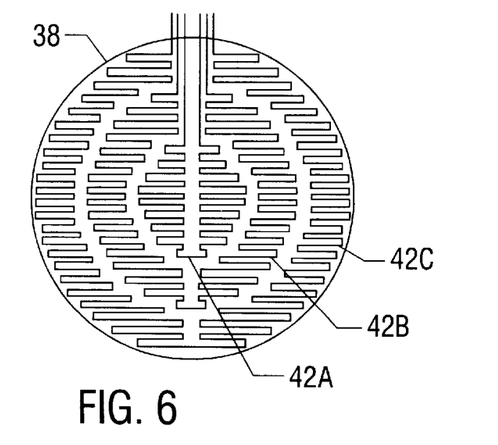
FIG. 6 is a top plan view of the foil heater lines of FIG. 5.
Figure 7:
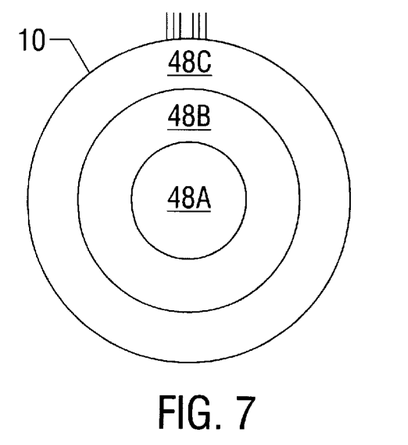
FIG. 7 is a top plan view of the foil heater zones created by the foil heater lines of FIG. 6.

FIGS. 5–7 show a preferred structure of foil heater 10 in accordance with the thermal cycling module of FIGS. 1 and 2. Foil heater 10 includes multiple lines 42A–C positioned between an upper layer 44 and a lower layer 46. Both the upper and lower layers 44,46 are formed from an insulating material, such as KAPTON®. Because lines 42A–C are made of an electrically conductive material, such as tungsten or nickel-chromium, each line 42A–C forms its own zone 48A–C, respectively, for conducting electric current through foil heater 10. The ends of lines 42A–C are connected to a power supply through a power modulator (not shown).

Foil heater 10 preferably has a watt density of at least 1.55 W/CM$^2$. If desired, lines 42A–C may be patterned to vary the watt density in specific regions of foil heater 10 to provide intentional temperature non-uniformities. For example, wafers undergoing processing often experience greater heat loss at their edges. To compensate for this heat loss, lines 42A–C may be patterned to provide a watt density that increases radially from the center of foil heater 10. Specific techniques for varying the watt density of a foil heater in this manner are well known in the art.

The number of heating zones to be included in foil heater 10 is dependent upon the desired complexity of the thermal cycling module as well as the size of the wafer to be processed. For example, foil heater 10 is presently preferred for 300 mm wafers. Of course, it will be apparent to one skilled in the art that foil heater 10 may have more heating zones or less heating zones if desired. Obviously, other shapes and geometrical arrangements of the heating zones are also possible. In addition, to avoid substrate contamination and to prevent wear, a protective film of aluminum or ceramic material may optionally be placed over the foil heater 10.

As alternative embodiments, foil heater 10 can be replaced, modified, or removed without departing from the scope of the invention. For example, thermoelectric devices, a cable heater, a cartridge heater or a cast-in heater could replace foil heater 10. In turn, a conventional thermally conductive plate to assist in positioning and heating could be positioned between substrate 2 and foil heater 10. Preferably, the conductive plate would be made of copper or other suitably thermally conductive material and have a thickness in the range of 1.0–5.0 mm to provide a low thermal mass. Lastly, for some applications, thermal cycling module 5 may only need heat exchanger 12 and radiation heater 14 to adequately heat and cool the desired substrate. Thus, foil heater 10 could be removed for some applications.

Figure 8:
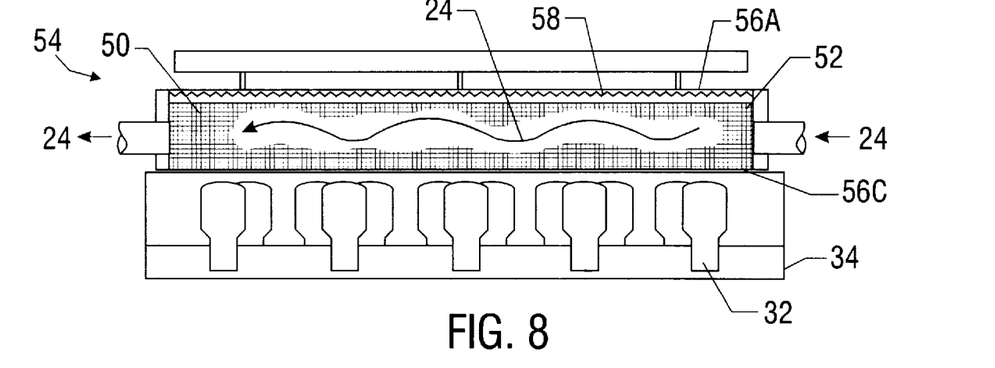
FIG. 8 is a horizontal cross-section view of an alternative embodiment of the thermal cycling module of the present invention.

FIG. 8 illustrates an alternative embodiment of thermal cycling module 5 of FIGS. 1 and 2. In this embodiment, a conductive porous material 50 fills chamber 52 of thermal cycling module 54, top surface 56A contains foil heater 58, and bulls-eye type radiation heater 34, of FIG. 4A, provides thermal conduction through bottom surface 56C and fluid 24 to substrate 2.

In particular, porous material 50 is interposed between upper surface 56A and lower surface 56C of heat exchanger chamber 52, and is rigidly attached to each surface by a method such as brazing. In a preferred embodiment, porous material 50 is an aluminum alloy foam. However, it can be any material that permits radial disbursement of thermally conductive fluid throughout. In turn, although it is preferred that the foam material has a high thermal conductivity, it is not necessary. An example of an aluminum alloy foam that could be used is sold under the name DUOCEL®, manufactured by Energy Research and Generation, Inc., located in Oakland, Calif. The manufactured foam material has a reticulated structure of open, duodecahedronal-shaped cells connected by continuous, solid metal ligaments.

The top surface 56A of heat exchanger 54 is formed with an insulation material such as a ceramic, quartz, or Teflon®. This top surface material, using conventional methods, allows lines 42A–C of FIG. 6 to be imbedded into top surface 56A. Imbedded foil heater 58 will provide the same control and uniformity as provided with the embodiment of FIGS. 1 and 2. Additionally, substrate 2 can be positioned directly over top surface 56A of heat exchanger 54.

As indicated above with reference to FIG. 4B, the bull-eye type radiation heater 34 provides the same uniform energy flux as the radiation heater 14 of FIGS. 1 and 2. Additionally, the bottom surface 56C has been changed to a thin conductive plate of aluminum, or some other similarly conductive material as previously used with top surface 26A of FIGS. 1 and 2.

Figure 9:
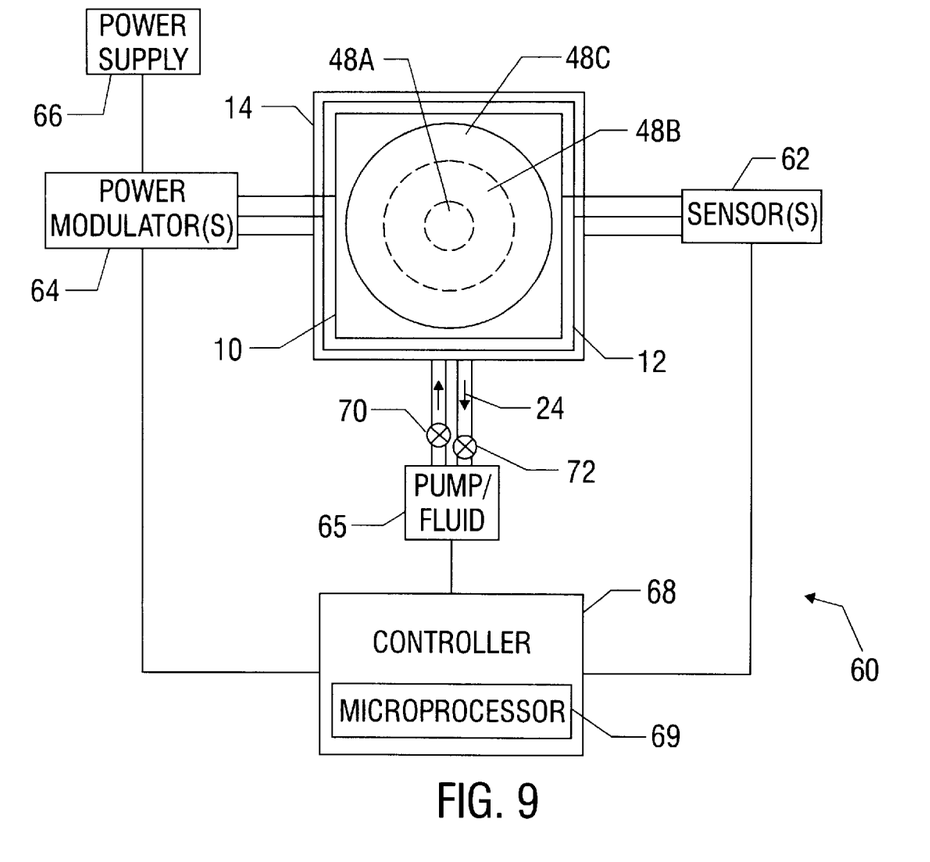
FIG. 9 is a schematic diagram of a feedback control loop according to the present invention.

Thermal cycling modules 5 and 54 of the present invention are preferably controlled by a feedback control loop. The feedback control loop is used to regulate the substrate temperature during the thermal cycling process. As illustrated in FIG. 9, a preferred control loop 60 for the present invention includes sensor(s) 62 and modulator(s) 64 electrically connected through a controller 68. Sensor(s) 62 sends electrical signals representative of a substrate temperature or process parameter to controller 68. Process parameters include thermal cycling parameters such as the temperature and flow pressure of fluid 24, and the temperature of radiation heater and/or foil heater zones. Each parameter can be monitored as frequently or as infrequently as necessary for a given thermal cycling process.

Based on the sensor signals received by controller 68, microprocessor 69 calculates control signals independently based upon desired process parameters for the thermal cycling process. The control signals are next sent to each respective power modulator 64. In response, power modulator(s) 64 controls the flow of electrical current to each respective zone of the connected foil heater 10, 58 and radiation heater 14, 34, if applicable. This allows one region of substrate 2 to be heated or cooled in a different manner than another region. Microprocessor 69 also calculates additional temperature control signals and sends the signals to fluid supply 24, and to outflow valve 70 and inflow valve 72 for increasing, stoppling, or decreasing the circulation of fluid 24 in heat exchanger 12.

Each sensor 62 may be either a temperature or process sensor, such as a thermocouple sensor, an infrared (IR) sensor, or a scattermoter. Techniques for mounting and positioning such sensors are well known in the art. Modulator(s) 64 is a device such as a solid-state relay circuit or a linear power amplifier. Power supply 66 and modulator(s) 64 preferably provide a variable supply of 120 V AC, however, any suitable voltage and/or direct current may also be used.

Persons of ordinary skill in the relevant arts will appreciate that additional modulators 64 can be used to individually interact with any or all zones defined by foil and radiation heaters 10 and 14, or controllable elements such as valves 70 and 72 and pump(s) 65. Additionally, it will be understood by a skilled artisan that controller 68 is programmed to control heat exchanger 12, radiation heater 14, and foil heater 10 appropriately to execute a thermal cycle. For example, controller 68 may be programmed to start a substrate at 23° C. and quickly ramp it up to 150° C. for 60 s, after which it is chilled to 23° C. for 30 s to complete the cycle.

Figure 10A:
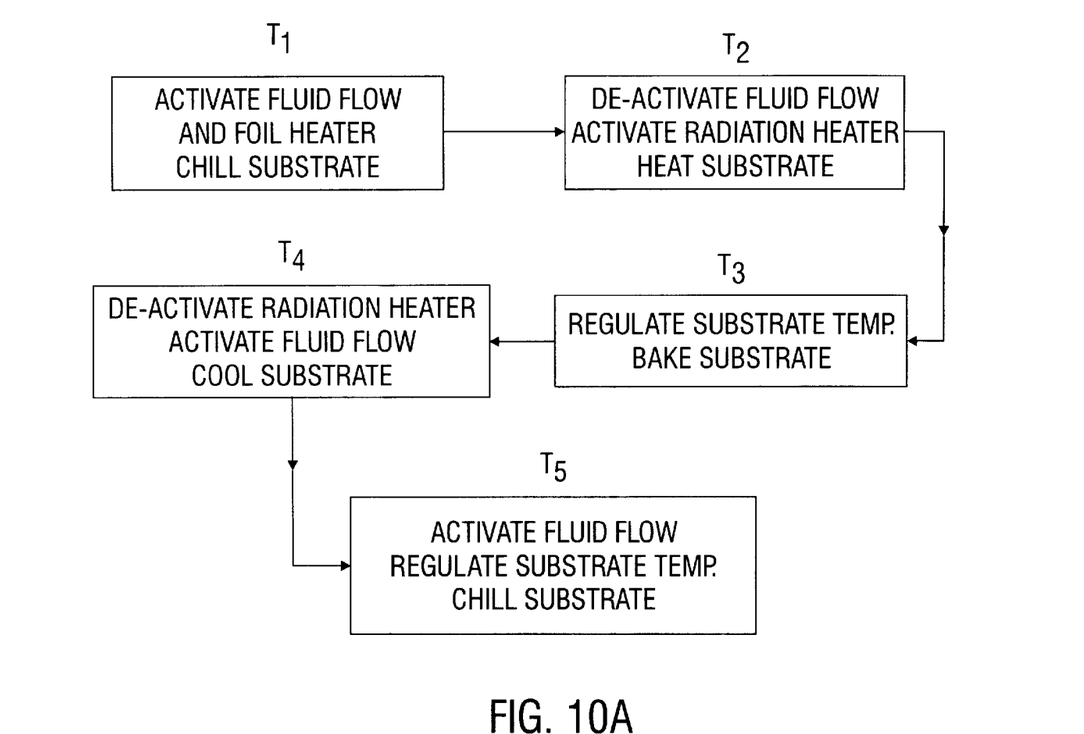
FIGS. 10A and 10B provide a flow chart and a graph illustrating the operational parameters for the thermal cycling process of the present invention.
Figure 10B:
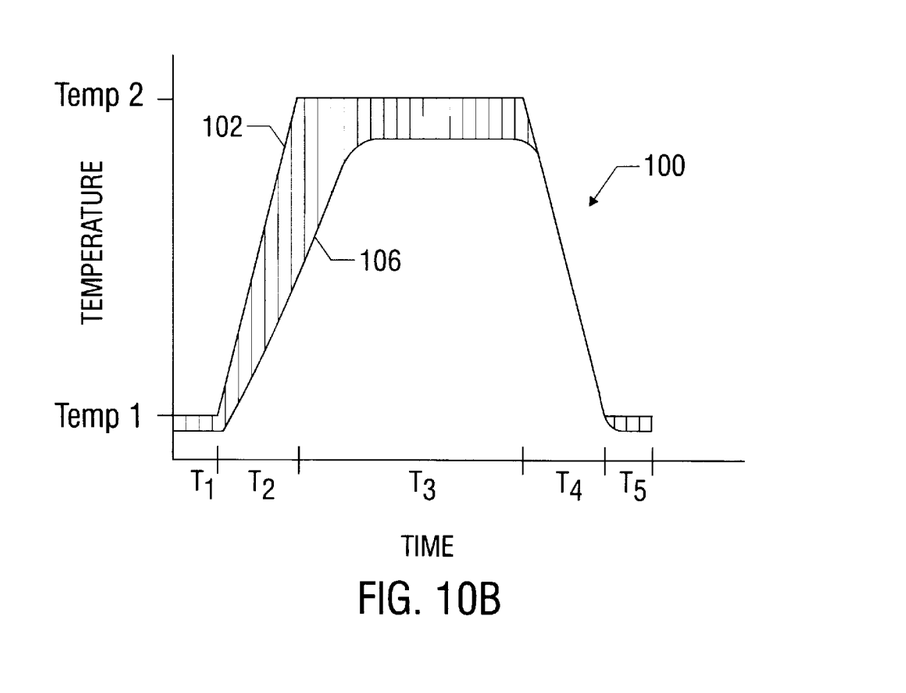

Referring now to FIGS. 10A and 10B, a general flow chart and graph are illustrated indicating a process for the present invention. In particular, FIG. 10B illustrates the desired temperatures during each predetermined time period $T_1$–$T_5$ for effectively baking and chilling a substrate when a foil heat is necessary to precisely regulate a substrate temperature. Through-out the process, the same single temperature fluid is used for both the baking and chilling stages. Consequently, this fluid is only heated once it is contained by the heat exchanger, otherwise it cools the substrate during chilling stages.

Curve 102 represents the desired process parameters of a thermal cycle, i.e. the desired temperature of the substrate at each time period $T_1$–$T_5$ in the thermal cycle. Curve 106 represents the temperatures which are achievable at each time period $T_1$–$T_5$ using heat exchanger 12 and radiation heater 14 without foil heater 10. Curve 106 approximates but does not directly match curve 102. The differential is indicated by the hatched region of the graph. Foil heater 10 provides the necessary incremental heat to achieve the desired substrate temperatures at each point in the thermal cycle, i.e. the amount indicated by the hatched region.

During time period $T_1$, controller 68 sets valves 70 and 72 to permit fluid 24 of about 20° C. to flow through heat exchanger 12. Fluid 24 circulating through heat exchanger 12 provides the necessary thermal transfer to chill substrate 2 effectively. However, because the substrate needs to maintain a precise temperature for a predetermined time period, and fluid pressures or sources may not always be constant, foil heater 10 is utilized. Consequently, controller 68 also calculates and sends a control signal to power modulator(s) 64 coupled to foil heater 10. This control signal allows sufficient current to flow through foil heater 10 to elevate the temperature to 23° C. If sensor(s) 62 indicates a temperature other than 23° C. at the substrate 2, then controller 68 calculates and sends a new control signal to power modulator(s) 64 in order to change the flow of electric current through foil heater 10. In this manner of feedback, the temperature of the foil heater 10, and of the substrate 2, is dynamically maintained at a uniform temperature.

At the start of time period $T_2$, controller 68 begins a transition phase to ramp the temperature from 23° C. to 150° C. by stopping the flow of fluid 24 through heat exchanger 12, and by sending a signal to modulator(s) 64 to activate the radiation heater 14 to a temperature of 147° C. Controller 68 may also send control signals to power modulator(s) 64 of the foil heater 10 to increase the current flow and more rapidly heat substrate 2. The flow of fluid 24 is stopped by closing valves 70 and 72 when heat exchanger 12 is filled to a desired level.

By the end of time period $T_2$, sensor(s) 62 indicates a temperature of 150° C., and controller 68 begins a baking time period $T_3$. Baking time period $T_3$ lasts for approximately 60 seconds, during which time a uniform temperature of 150° C. is maintained through feedback in the same manner as the temperature was maintained at 23° C.

Next, at the start of time period $T_4$, the substrate temperature is ramped from 150° C. to 23° C. In order to provide a faster cooling stage, controller 68 opens valves 70 and 72 to allow the same 20° C. fluid 24 used to fill heat exchanger 12 to now flow through it again. Controller 68 also sends a control signal to power modulator(s) 64 of radiation heater 14 to deactivate. The electric current through foil heater 10 will continue to compensate for the cool liquid entering heat exchanger 12. Although foil heater 10 can be deactivated during time period $T_4$, it is preferably left active to prevent extreme temperature fluctuations that might otherwise damage substrate 2.

Once sensor(s) 62 of substrate 2 indicates a temperature of 23° C. at the end of time period $T_4$, controller 68 begins a chill phase of time period $T_5$. At this point, a uniform temperature of 23° C. is maintained through feedback. After about 25 seconds, the chill phase is completed, the thermal cycle is complete.

Anyone skilled in the relevant arts will be able to program the controller to execute this and many other thermal cycles involving any number of phases and transitions of different types. As an alternative embodiment, fluid pump(s) 65 for circulating fluid 24 can be used to clear the inside of the heat exchanger 12, e.g., by suction, before, during or after any cycle phase of the thermal cycle module 5.

The fluid supply for the above process is preferably set 2–10° C. colder than a corresponding desired process temperature. This is to ensure that heat supplied by foil heater 10 may be used to compensate for any temperature fluctuations. Stated another way, because foil heater 10 is only capable of heating, it may only compensate for variations from a desired process temperature by increasing or decreasing the amount of heat it transfers to substrate 2. Accordingly, the fluid supplies are set lower than the desired process temperatures to ensure that foil heater 10 may be used for precise temperature control. As an alternative embodiment, a conventional heat could be provided to heat fluids before they reach the heat exchanger for baking stages, or a flow of gas, such as helium, could be provided beneath the substrate to improve conductivity.

The thermal cycling module of the present invention may be used for purposes other than wafer photoresist processing. For example, the module may be used in the manufacturing of flat panel displays, in polymerase chain reaction (PCR) processes, in thermal fatigue testing, in thermal deformation measurement, in reliability testing, and in any other application which requires precisely controlled thermal cycling.

In view of these and many other variations which will be apparent to anyone of ordinary skill in the relevant arts, the scope of the invention should be determined by the following claims and their legal equivalents.

What is claimed is:

1. A thermal cycling module comprising:
   a heat exchanger having a top and a bottom surface separated by a periphery surface;
   one or more fluid chambers disposed within said heat exchanger;
   a radiation heater in thermal contact with the bottom surface of the heat exchanger, said radiation heater comprising a plurality of bulb heaters arranged to provide uniform heat distribution across said bottom surface of said heat exchanger; and
   a power source in electrical contact with said radiation heater.

2. The thermal cycling module of claim 1, wherein said radiation heater includes a plurality of longitudinal light bulbs positioned along a planar surface in a radial direction toward the center of said radiation heater.

3. The thermal cycling module of claim 1, wherein said radiation heater includes a plurality of light bulbs positioned perpendicularly to the bottom surface and arranged to provide a plurality of concentric rings of light bulbs radially separated from each other.

4. The thermal cycling module of claim 1, wherein said radiation heater includes a plurality of longitudinal light bulbs positioned across a planar surface, parallel to the bottom surface of the heat exchanger, in a grid-like arrangement.

5. The thermal cycling module of claim 1, further comprising a thermally conductive plate in thermal contact with the upper surface of the heat exchanger.

6. The thermal cycling module of claim 1, wherein said fluid chamber includes a porous material disposed therein.

7. The thermal cycling module of claim 6, wherein the porous material comprises an alloy foam.

8. The thermal cycling module of claim 1, further including a control system comprising at least one sensor, a microprocessor, and a power modulator.

9. The thermal cycling module of claim 1 further comprising a heating element in thermal contact with and fixedly connected to the periphery or top surface of the heat exchanger.

10. The thermal cycling module of claim 9, wherein said heating element further includes a foil or a cable heater.

11. The thermal cycling module of claim 10, wherein the foil heater further includes a plurality of zones.

12. The thermal cycling module of claim 9, wherein said heating element further includes an array of thermoelectric devices.

13. A thermal cycling module comprising:
    a heat exchanger having a top and a bottom surface separated by a periphery surface;
    one or more fluid chambers disposed within said heat exchanger;
    a heating element in thermal contact with and fixedly connected to the periphery or top surface of said heat exchanger;
    a radiation heater in thermal contact with the bottom surface of the heat exchanger, said radiation heater comprising a plurality of bulb heaters arranged to provide uniform heat distribution across said bottom surface of said heat exchanger; and
    a power source in electrical contact with the radiation heater.

14. A method of thermally cycling a material substrate, the method comprising:
    positioning the substrate in thermal contact with a heat exchanger and a first and a second heating element, the heat exchanger having a fluid chamber disposed therein;
    filling said fluid chamber with a thermally conductive fluid;
    generating heat from the first heating element to the heat exchanger and the substrate;
    generating heat from the second heating element to the heat exchanger for a predetermined time period; and
    circulating the thermally conductive fluid through said fluid chamber after the predetermined time.

15. The method of claim 14, wherein the thermally conductive fluid used for the steps of filling and circulating is the same temperature.

16. The method of claim 14, further including the steps of:
    sensing process parameters;
    calculating a control signal based on the sensed process parameters; and
    changing a flow of current through the first and second heating elements in accordance with the calculated control signal.

* * * * *